United States Patent [19]

Pye

[11] Patent Number: 5,471,136
[45] Date of Patent: Nov. 28, 1995

[54] TEST SYSTEM FOR CALCULATING THE PROPAGATION DELAYS IN SIGNAL PATHS LEADING TO A PLURALITY OF PINS ASSOCIATED WITH A CIRCUIT

[75] Inventor: Richard Pye, Stockport, United Kingdom

[73] Assignee: Genrad Limited, United Kingdom

[21] Appl. No.: 146,989

[22] Filed: Nov. 2, 1993

Related U.S. Application Data

[63] Continuation-in-part of Ser. No. 898,229, Jun. 12, 1992, abandoned.

[30] Foreign Application Priority Data

Jul. 24, 1991 [GB] United Kingdom ............ 9115992

[51] Int. Cl.$^6$ .................................................. G01R 31/28
[52] U.S. Cl. ........................................ 324/158.1; 324/73.1
[58] Field of Search ............................ 324/158.1, 73.1, 324/760, 765, 754; 371/15.1, 25.1, 22.3, 27, 1; 364/571.01, 270.2

[56] References Cited

U.S. PATENT DOCUMENTS

| | | | |
|---|---|---|---|
| 4,660,197 | 4/1987 | Wrinn et al. ................................ | 371/1 |
| 4,703,448 | 10/1987 | Muething, Jr. ............................. | 364/481 |
| 4,724,378 | 2/1988 | Murray et al. ............................. | 324/74 |
| 4,796,259 | 3/1989 | Troy ............................................ | 324/754 |
| 4,908,576 | 3/1990 | Jackson ...................................... | 324/754 |
| 4,928,062 | 5/1990 | Miles et al. ................................ | 324/766 |
| 4,928,278 | 5/1990 | Otsuji et al. ............................... | 364/571.01 |
| 4,929,888 | 5/1990 | Yoshida ...................................... | 324/158.1 |
| 4,931,723 | 6/1990 | Jeffrey et al. .............................. | 324/73.1 |
| 5,032,789 | 7/1991 | Firooz et al. ............................... | 324/754 |
| 5,212,443 | 5/1993 | Wert et al. .................................. | 324/73.1 |
| 5,225,772 | 7/1993 | Cheung et al. ............................. | 324/73.1 |
| 5,274,796 | 12/1993 | Conner ........................................ | 364/270.2 |

OTHER PUBLICATIONS

"Closed-Loop Error Correction: A Unique Approach to Test System Calibration" by Dahl; published in Feb., 1987.
"Timing Generation For DSP Testing"; by Rosenfeld; published in Apr. 1988.

*Primary Examiner*—Vinh P. Nguyen
*Attorney, Agent, or Firm*—Rockey, Rifkin and Ryther

[57] ABSTRACT

Propagation delays in signal paths leading to respective pins in an array of test system pins are determined using a probe which is wiped across the pins. Timing signals are applied to each of the signal paths in parallel, and pin identifying signals are applied to each of the signal paths such that each signal path and the pin to which it is connected receives a different pin identifying signal. When the probe is wiped across the pins, it detects signals on each of the pins with which it comes into contact. Any pin with which the probe is in contact is identified by detection of the pin identifying signal. The identifying and timing signals alternate, and once a pin has been identified, the timing signals on that pin are detected. The propagation delay in the signal path to the identified pin is then calculated from the detected timing signals.

14 Claims, 6 Drawing Sheets

TEST SYSTEM FOR CALCULATING THE PROPAGATION DELAYS IN SIGNAL PATHS LEADING TO A PLURALITY OF PINS ASSOCIATED WITH A CIRCUIT

CROSS-REFERENCE TO RELATED APPLICATIONS

This application is a continuation-in-part of application Ser. No. 07/898,229 filed on Jun. 12, 1992, now abandoned.

BACKGROUND AND SUMMARY OF THE INVENTION

The present invention relates to a test system and, in particular, to a test system which can be calibrated to take account of propagation delays which occur in signal paths leading to respective pins of the test system.

Test systems are widely used to enable circuit components such as boards or individual electronic components to be tested. The known test systems generally comprise sophisticated test electronics including signal generation circuits for producing a large number of test signals including D.C. voltage levels and timing signals. It may be necessary to provide the capacity to generate several thousand different test signals and thus the test electronics are expensive and must be adaptable so they can be used to test a variety of different components. Thus, it is conventional practice to provide an interface known as a test "fixture" to connect a board or other component to be tested to the test electronics.

Typically, the test electronics is housed in a cabinet provided with an array of output pins housed in a structure known as a "receiver". When a new design of board is to be tested, a fixture is produced which acts as an interface between the board under test and the receiver. The fixture effectively plugs into the receiver and the board under test plugs into the fixture. Signal paths are wired between fixture pins that contact the receiver and fixture pins that contact the board.

In many test operations, it is necessary to generate timing signals that arrive at the board with a predetermined phase relationship. Although the appropriate phase relationship can be established at the source of the signals in the signal generator, these signals are propagated along different signal paths to the receiver, and along different signal paths through the fixture. The different signal paths introduce propagation delays which may vary from one path to another.

The problem of non-uniform propagation delays is well known and is conventionally addressed by incorporating calibration circuitry. Such circuitry includes delay devices arranged in the signal paths to add delays selectively such that all of the propagation delays in the signal paths are substantially equal. Various proposals have been made to connect propagation delay measurement circuits either to the receiver (on the assumption that propagation delays in the fixture have been approximately equalized by careful design of the signal paths within the fixture) or to pins that contact the component under test directly.

One known system is described in the article "Closed loop error correction: a unique approach to test system calibration" by Mark Dahl, published as paper 32.2 of the 1987 International Test Conference, CH 2347-2/87/0000/0772. This paper describes calibration support circuitry which is a separate unit from the test system and can, therefore, be placed in a mobile calibration unit such that can be shared by many tester systems. Contacts of a test fixture are probed by a signal probe that is driven by an X-Y positioning device across the fixture. The positioner moves at a speed that enables, for example, 256 pin channels to be probed in less than 60 seconds. The source of signals picked up by the probe are identified by reference to the location of the positioner relative to the fixture. This arrangement avoids the conventional requirement for each tester to incorporate internal calibration circuitry to which signals are routed back from the fixture pins through a complex network of cables and switches, but this is at the expense of providing a precision piece of equipment to drive the positioner, and using a standard fixture structure that fits the positioning equipment.

It is also known to provide a simple electrical continuity detector in the form of a probe that is manually "wiped" across the pins of, for example, a fixture. Signals picked up by the probe enable the presence or absence of DC levels on the fixture pins to be detected. This system does not enable information to be derived from the wiped pins which could be used, for example, to measure propagation delays in signal paths leading to the pins.

It is an object of the present invention to provide a test system which can be used to derive timing calibration data using a simple probe to wipe pins carrying timing signals.

According to the present invention, there is provided a test system for determining propagation delays in signal paths leading to respective pins in an array of pins, comprising means for applying timing signals to each of the signal paths in parallel, means for applying pin identifying signal to each of the signal paths, a different pin identifying signal being applied to each signal path, a probe which can be wiped across the pins to detect signals on each pin with which it comes into contact, means for identifying a pin with which the probe is in contact from the pin identifying signals detected by the probe, and means for calculating the propagation delay in the signal path leading to an identified pin with which the probe is in contact from the timing signals detected by the probe.

Preferably, the timing signals and pin identifying signals are applied alternately to each of the signal paths. Each pin identifying signal may comprise a rectangular wave embodying a digital code allocated to the respective pin, and means may be provided to generate a strobe pulse signal synchronized with the pin identifying signals applied to the signal paths such that each strobe pulse coincides in time with a respective portion of the rectangular wave that represents one bit of the digital code. The duration of each portion of the rectangular wave is selected to be sufficient to ensure that the strobe pulses continue to coincide in time with the respective portions of the rectangular wave despite delays in propagation of the rectangular waves in the signal paths leading to the pins for which they are detected, and means are provided to sample the identifying signals in synchronism with the strobe pulses to derive the digital codes.

Preferably, the timing signals comprise a rectangular wave of fixed frequency applied in phase to each signal path, and the calculating means comprises means for comparing the phase of the timing signals detected by the probe. The calculating means may comprise means for sampling each timing signal detected by the prober with a common clock signal having a different frequency from said fixed frequency to produce sampled data. The calculating means may further comprise means for detecting an edge in the sampled data, and means for recording a cycle count corresponding to the number of cycles in the common clock signal from the initiation of a timing signal to the detection of an edge.

Preferably, means are provided for detecting loss of electrical contact between the probe and a pin in an interval of time during which identifying or timing signals are being applied to that pin, signals detected during intervals of time in which loss of electrical contact is detected being rejected.

Preferably, each identifying signal and timing signal comprises a rectangular waveform which alternates between two voltage levels, and means are provided to maintain the probe at a third voltage level to the probe if the probe is not in electrical contact with any external voltage source, the loss of contact detecting means comprising means for detecting the said third voltage.

The invention also provides a method for determining propagation delays in signal paths leading to respective pins in an array of pins, wherein timing signals are applied to each of the signal paths in parallel, pin identifying signals are applied to each of the signal paths such that each signal path and the pin to which it is connected receives a different pin identifying signal, a probe is wiped across the pins to detect signals on each of the pins with which it comes into contact, any pin with which the probe is in contact is identified by detection of the pin identifying signal, timing signals on an identified pin are detected, and the propagation delay in the signal paths to the identified pin is calculated from the detected timing signals.

BRIEF DESCRIPTION OF THE DRAWINGS

An embodiment of the present invention will now be described, by way of example, with reference to the accompanying drawings, in which.

DETAILED DESCRIPTION OF A PREFERRED EMBODIMENT

Figure 1:
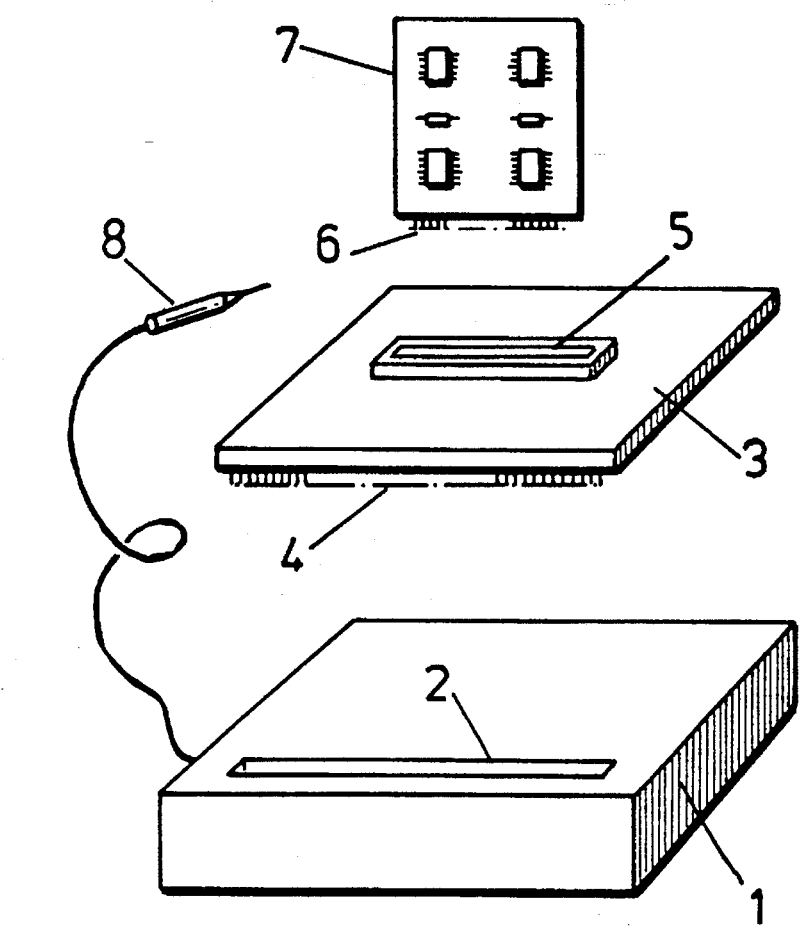
FIG. 1 is a schematic diagram of a system in accordance with the present invention.

Referring to the drawings, FIG. 1 is a highly schematic illustration of the basic components of a circuit board tester embodying the invention. It comprises a tester 1 incorporating circuitry for generating test signals including timing signals and defining a connector or receiver 2 to which an interface or test fixture can be connected. The fixture supports contacts 4 which can be interconnected with the receiver 2 and a socket 5 into which edge connectors 6 of a circuit board 7 to be tested can be inserted. It will be appreciated that other forms of test fixtures may be used, e.g., "bed-of-nails" fixtures in which spring loaded pins enable contact to be made with selected points in the underside of a board. The fixture 3 is provided simply to make appropriate connections between contacts in the socket 5 and contacts in the receiver 2. Simple wire wrapping techniques are generally used to make the required interconnection.

Timing signals generated by the tester 1 are applied to the pins 6 of the board under test. It is generally necessary to ensure that such timing signals arrive at the pins of the board under test with a predetermined phase relationship. Propagation delays inevitably occur in the signal paths established between the timing signal generation equipment in the tester 1 and the pins 6 of the board. It is necessary to introduce controlled delays in the signal paths such that all of the signals arrive at the board pins with appropriate relative phase. Some means must be provided to enable the propagation delays to be measured, ideally by measurements taken at the board pins themselves, but alternatively at the receiver 2 if the fixture has been carefully designed to ensure substantially equal propagation delays through signal paths within the fixture.

The present invention provides a probe 8 which can be manually wiped across the pins 6 or contacts in the receiver 2. Signals detected by the probe enable appropriate delays to be introduced into the signal paths, either automatically using a closed control loop or alternatively in a separate calibration routine. The embodiment described below uses a separate calibration routine rather than a closed control loop.

Figure 2:
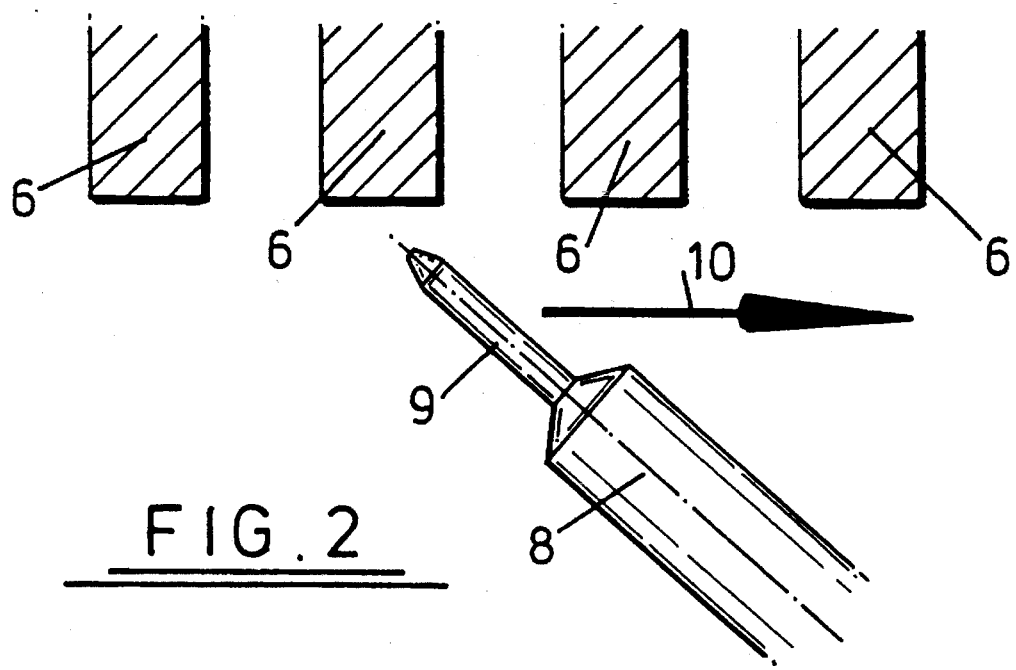
FIG. 2 illustrates an array of tester pins across which a probe shown in FIG. 1 is wiped.

FIG. 2 illustrates the pins 6 of a board mounted in the socket 5 of FIG. 1. The pins 6 will typically be arranged with a pitch of 0.1 inches. The probe 8 has a tip 9 which is sufficiently small to avoid contact with two pins 6 simultaneously. The probe tip 9 is wiped across the pins 6 as indicated by arrow 10.

Figure 3:
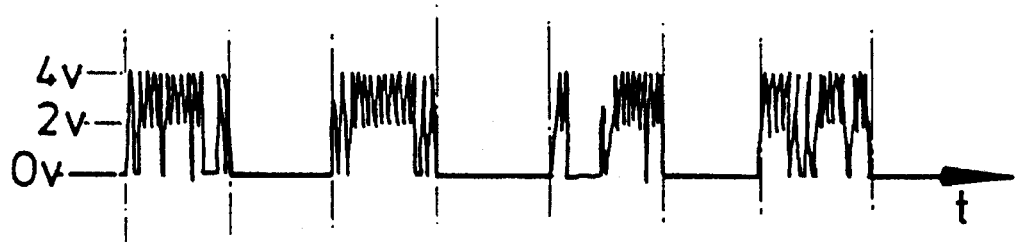
FIG. 3 illustrates signals detected by the probe of FIG. 2.

FIG. 3 illustrates waveforms appearing on the probe tip 9 as it is wiped across the pins 6. A resistor (not shown) is connected in the probe 8 to ground such that the voltage on tip 9 is zero volts when the probe is out of contact with the pins, or when no signals are present on contacted pins. The signals applied to the pins alternate between 2 volts and 4 volts.

Figure 4:
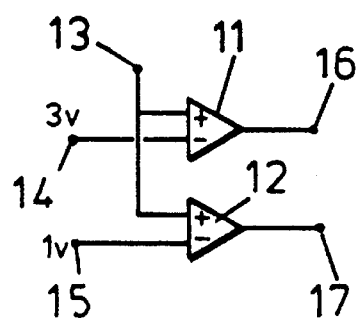
FIG. 4 illustrates in simplified form a circuit to which the signals detected by the probe of FIG. 2 are applied.

FIG. 4 illustrates a circuit to which the voltage picked up by the probe tip is applied. The circuit comprises two comparators 11 and 12, the positive input of each comparator being connected to terminal 13 to which the probe is connected, and the negative inputs being connected to fixed potentials of 3 volts and 1 volt, respectively, applied to terminals 14 and 15. The circuit thus provides two outputs at terminals 16 and 17, respectively.

Figure 5:
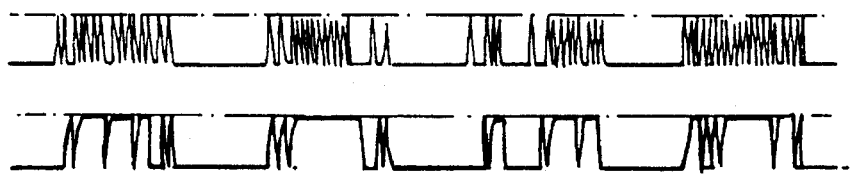
FIG. 5 illustrates waveforms output from the circuit of FIG. 4.

Referring to FIG. 5, the upper waveform represents the output on terminal 16, and the lower waveform the output on terminal 17. Waveforms derived from four consecutively wiped pins are illustrated. The upper waveform follows transitions to or from 4 volts, whereas the lower waveform follows transitions to or from zero volts. Thus, the lower waveform indicates whether or not the probe is in contact with a pin to which a voltage of 2 or 4 volts is being applied.

Figure 6:
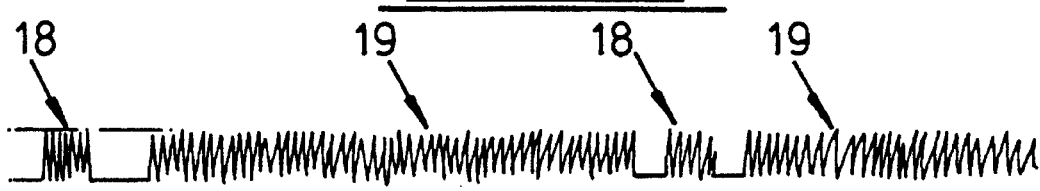
FIG. 6 is an enlarged illustration of part of the waveform of FIG. 5.

FIG. 6 is an enlargement of a portion of one of the four waveforms shown in the upper part of FIG. 5. It will be seen that the signal comprises relatively short sections 18 which, as described below, identify the pin with which the probe is in contact, and longer sections 19 which carry timing information. The pin identifying sections 18 are interleaved with the timing sections 19. The overall cycle repeats approximately every 100 microseconds, such that twenty complete cycles will occur during a period of contact between the probe and a pin of 2 milliseconds. This period of contact will be achieved given a reasonably fast wipe of the probe across pins with a pitch of 0.1 inches.

Figure 7:
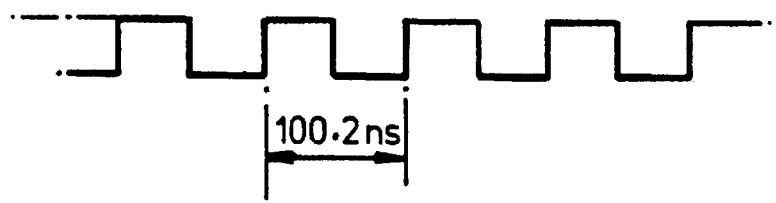
FIG. 7 illustrates a further enlarged first portion of the waveform of FIG. 6.
Figure 8:
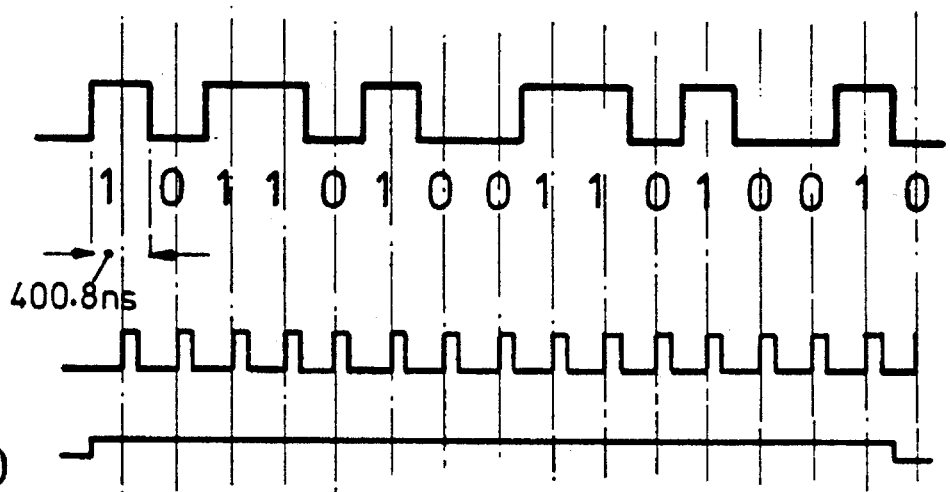
FIG. 8 illustrates a further enlarged second portion of the waveform of FIG. 6 and associated timing waveforms used to extract a pin identifying signal from the second portion.

Referring to FIG. 7, this illustrates the square wave timing signals output from terminal 16 of FIG. 4 during the timing sections 19 of FIG. 6. Each cycle of the signal has a duration of 100.2 nanoseconds. All of the pins carry the same timing signals. If all of the signal paths leading to the pins were to have identical propagation delays, the timing section signals on the pins would be exactly in phase. Referring to FIG. 8, in contrast, the upper waveform illustrates the identifying signal output from terminal 16 of FIG. 4 applied to one only of the pins during a signal portion 18. This signal represents a pin identification code of 1011010011010010, or B4D2 in hexadecimal. Each pin carries a respective identification code. The middle waveform of FIG. 8 represents strobe signals which determine when each bit of the pin identification code should be read, and the lower waveform of FIG. 8 represents a "contact made or contact lost" signal derived from terminal 17 of FIG. 4. Each bit of the pin identification waveform has a duration of 400.8 nanoseconds. Thus, the pin identification signal is transmitted sufficiently slowly that the strobe signals will always line up with respective bits of the rectangular code carrying waveform regardless of propagation delays in the signal paths. If the lower waveform indicates a loss of contact between the probe and a pin during transmission of an identification code, the identification code is ignored and the circuitry simply awaits receipt of the next identification code signal section 18.

Figure 9:
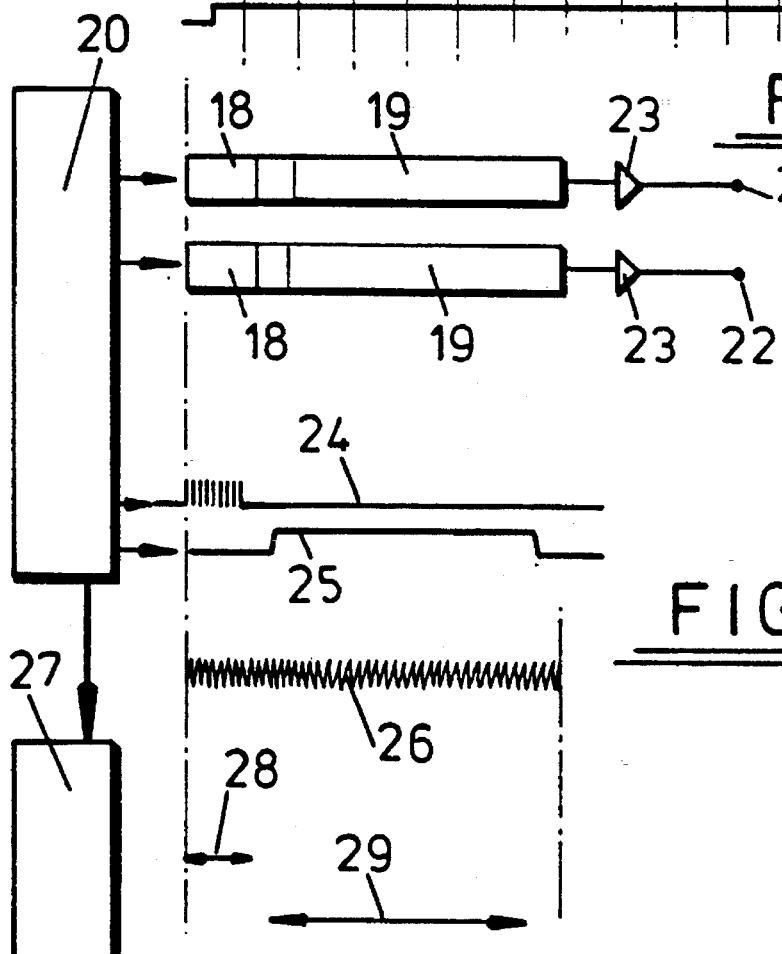
FIG. 9 is a schematic illustration of the operation of the system of FIG. 1.

Referring now to FIG. 9, this schematically illustrates the overall system operation. A tester control system 20 outputs identification and timing signals to the receiver contact pins, only two of which are represented by terminals 21 and 22. It is the terminals 21 and 22 that are wiped with the probe. Pin identification sections 18 carry respective pin identification codes and timing signal sections 19 carry the common timing signals. The signals are transmitted through signal paths, each of which incorporates a driver 23 that can be controlled to add a propagation delay to the respective path. The tester control system also outputs the strobe signal 24 (middle waveform of FIG. 8) and a measurement control signal 25 which has a duration equal to five hundred cycles of a sampling clock waveform 26. The signal 25 defines the period of time within which measurements of the timing signal are to be made.

The sampling clock signal 26 has a cycle duration of 100 nanoseconds and is used in edge detection as described below. A logic unit 27 searches for pin identity codes in a timing window represented by arrow 28, defined by the strobe signal 24. When a valid pin identity code is detected, this information is processed as described below. When an edge is detected in a timing window indicated by arrow 29, and defined by measurement control signal 25, its position or cycle count in the five hundred cycle measurement period defined by signal 25 is detected. This edge position is then used to determine the propagation delay in the signal path to the identified pin.

Edge detection is described with reference to FIG. 10. To make it easier to represent the edge detection process in a drawing, FIG. 10 indicates a measurement cycle of 110 nanoseconds rather than 100.2 as actually used, and an edge detection sampling clock signal with a cycle duration of 100 nanoseconds which is the cycle actually used. Waveform A represents a measurement signal derived from pin 21 having a skew of 40 nanoseconds, waveform B represents a measurement signal derived from pin 22 having a skew of zero and waveform C represents the edge detection sampling clock signal. The signal of waveform A is sampled and the resultant sampled data is represented by waveform D. The signal of waveform B is sampled and the resultant sampled data is represented by waveform E. There is thus an apparent skew of four cycles as represented by arrow 30, that is four times the difference between the duration of the cycles of the measurement signals and the sampling clock, or 40 nanoseconds. Cycle counts are indicated at F in FIG. 10, such that the detected edges have cycle counts of 1 and 5 for waveforms B and A, respectively. Cycles are counted in synchronism with waveform C and this relationship between the sampling clock and the waveform count is maintained throughout a measurement period.

Figure 10:
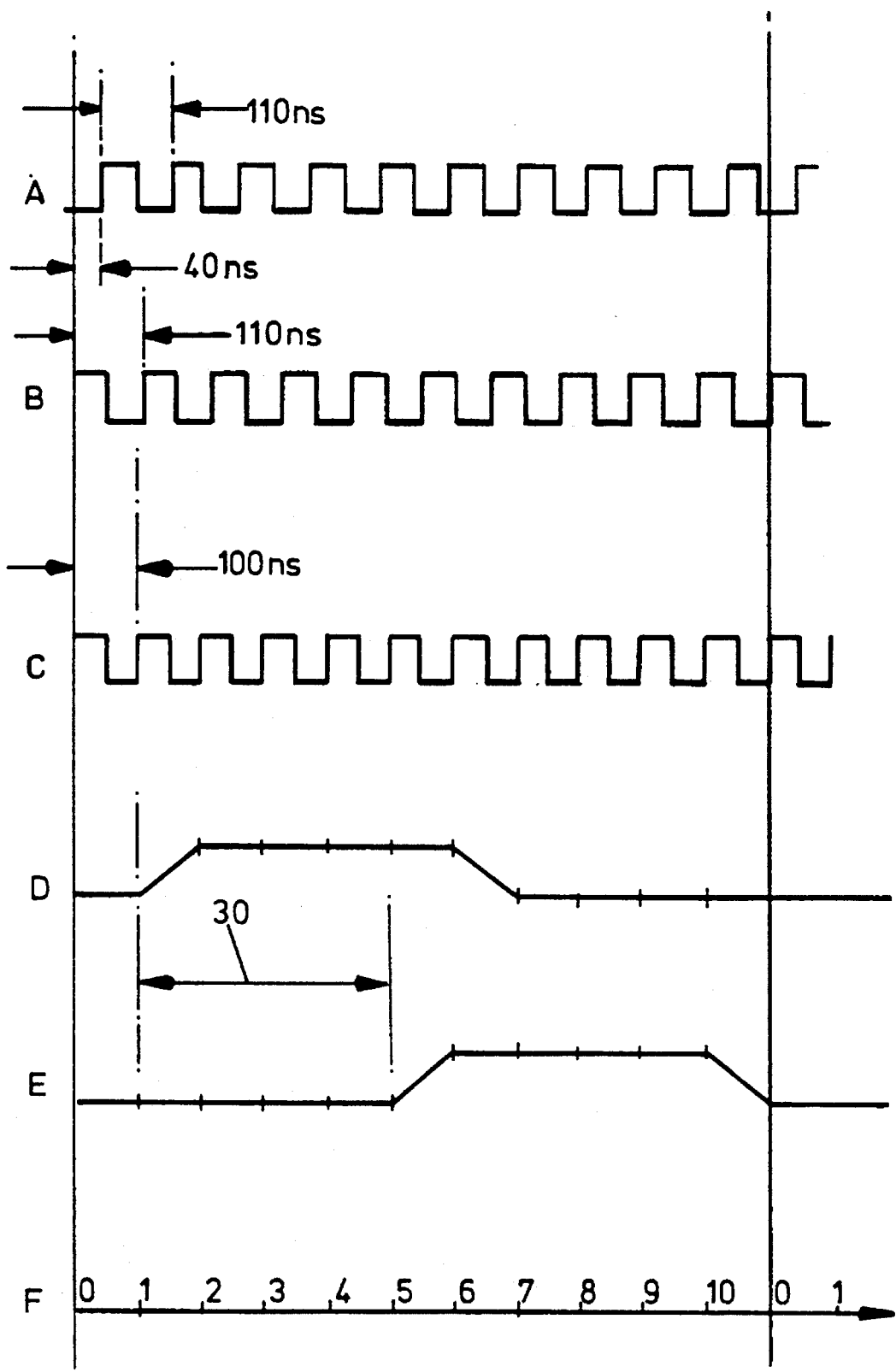
FIG. 10 illustrates the calculation of skew in the system of FIG. 1.
Figure 10A:
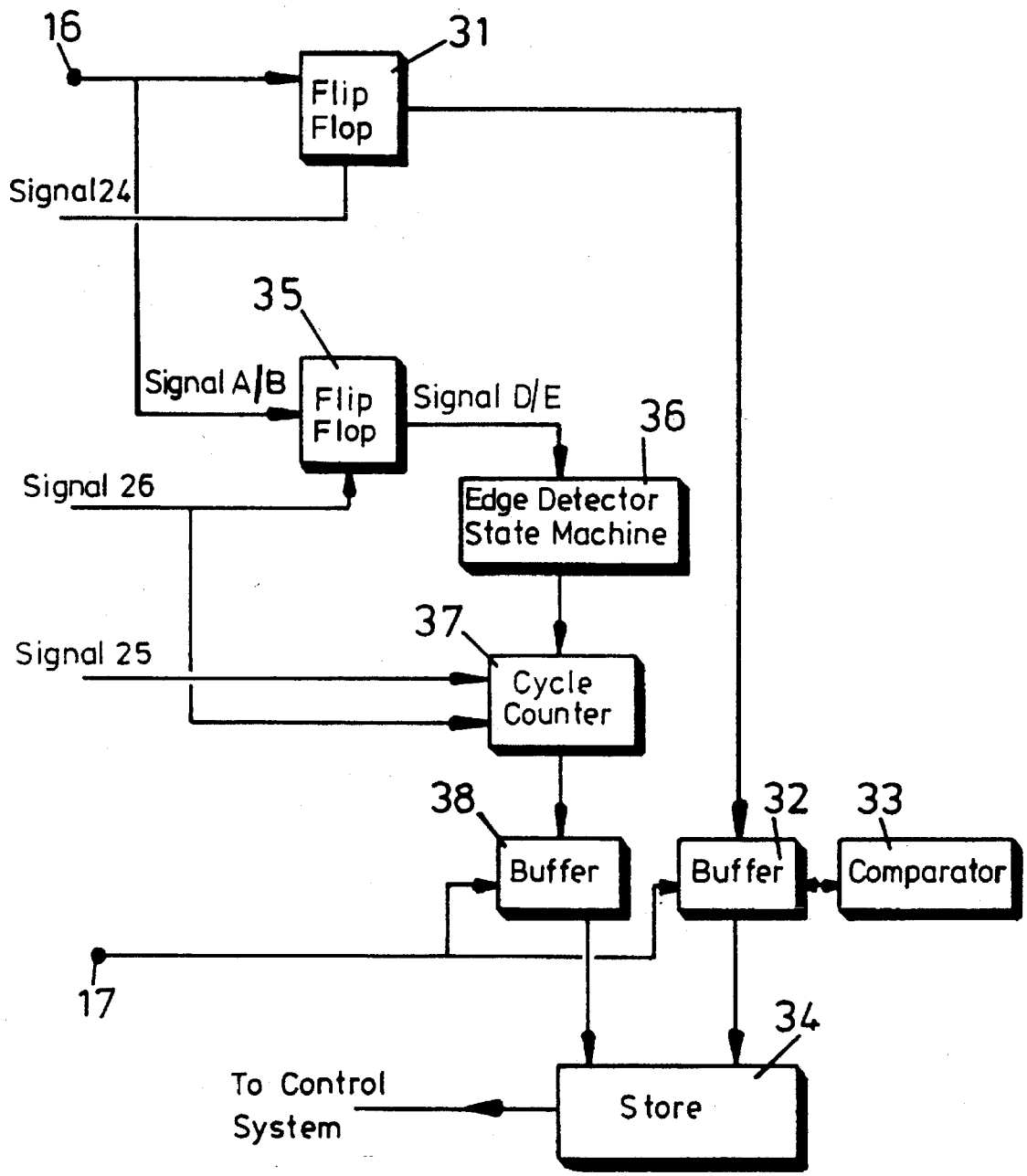
FIG. 10A illustrates the structure of the edge detection circuitry incorporated in logic unit 27 of FIG. 9.

FIG. 10A illustrates the structure of the edge detection circuitry incorporated in the logic unit 27 of FIG. 9. The signals shown in FIG. 5 which appear at terminals 16 and 17 (FIG. 4) provide the basic pin identification and timing measurement data, and the signals 24, 25 and 26 (FIG. 9) control the pin identification and edge detection processes.

The signal on terminal 16 is applied to a first flip-flop 31 that is clocked by the strobe signal 24. The strobe signal is present only during the pin identification code section 18 of the signals appearing on the wiped terminal. The output of the flip-flop 31 is a clean square wave representing pin identity, the square wave having been synchronized with the strobe signal as a result of the operation of the flip-flop. The strobe signal is itself synchronized with the pin identification code signals applied to the fixture 3 (FIG. 1). Thus, propagation delays and distortion introduced by the signal paths leading to the wiped terminals do not affect the output of the flip-flop 31.

The output of the flip-flop 31 is applied to a buffer 32 associated with a comparator 33. The comparator 33 compares the last two received pin identification codes and releases the code to a memory storage unit 34 only if there is no identity between the two compared codes. The buffer 32 receives the "contact lost" signal from terminal 17 and prevents release of the last pin identification code from the buffer in the event that contact is lost.

The signal on terminal 16 is also applied to a second flip-flop 35 which processes the timing measurement section 19 of the signals appearing on the wiped terminals. Thus, the flip-flop 35 receives the timing measurement signals, examples of which are represented in FIG. 10 by waveforms A and B. The flip-flop 35 is clocked by the signal 26 (waveform C in FIG. 10) and, thus, its output corresponds to sampled data examples of which are represented in FIG. 10 by waveforms D and E. The sampled data output of the flip-flop 35 is processed by an edge detector state machine 36 which detects the positions of edges in the sampled data.

The signals 25 and 26 are applied to a cycle counter 37 which receives the output of the flip-flop 35 through the edge detector 36, the signal 25 defining the timing window represented by arrow 29 in FIG. 9 and the signal 26 which clocks the counter. The resultant count is applied to a buffer 38 which releases the count to the memory storage unit 34 unless the signal on terminal 17 indicates a loss of pin contact. Thus, the memory storage unit receives and stores data identifying the pins from which timing measurement signals have been received and the skew of the received timing measurement signals.

The data stored in the memory storage unit 34 is used to control the propagation delay added by the drivers 23 (FIG. 9) that are incorporated in each of the signal paths leading to the terminals wiped by the probe. The stored data gives the skew for each of the signal paths, and the drivers 23 are controlled such that the propagation delay in each signal path, including the delay introduced by the respective driver 23, is the same for every other signal path. Once this has been achieved by appropriate setting of the controls to the drivers 23, there will be no skew between the signal paths, and testing of the components can proceed.

The edge detector is a state machine that, in the illustrated example, would detect a rising edge as the occurrence of a sequence 0001 in the sampled data. The cycle count would thus be logged when the edge detector detects a "1" after a series "000". The edge detector could have control inputs to detect a rising edge start (0001), a falling edge start (1110), a rising edge end (0111) or a falling edge end (1000).

FIG. 10 seeks to explain essentially conventional under-sampling techniques used for edge detection. Given the actual measurement signal and clock cycles used of 100.2 and 100 nanoseconds, the sampled data would, of course, provide much greater accuracy. Edges would also typically only be registered after say fifteen "0"s followed by a "1".

The data obtained as described above gives a pin identity for each measurement signal and a cycle count for an edge detected in the measurement signal (a cycle count of up to 500). The skew between any two pairs is then calculated by multiplying the difference between the cycle counts by the difference in period between the measurement signal and the sample clock signal (0.2 nanoseconds in the case described in FIGS. 7 and 8). If the skew exceeds the sample clock period, aliasing results. Thus, care must be taken to ensure that the skew cannot exceed this limit.

Figure 11:
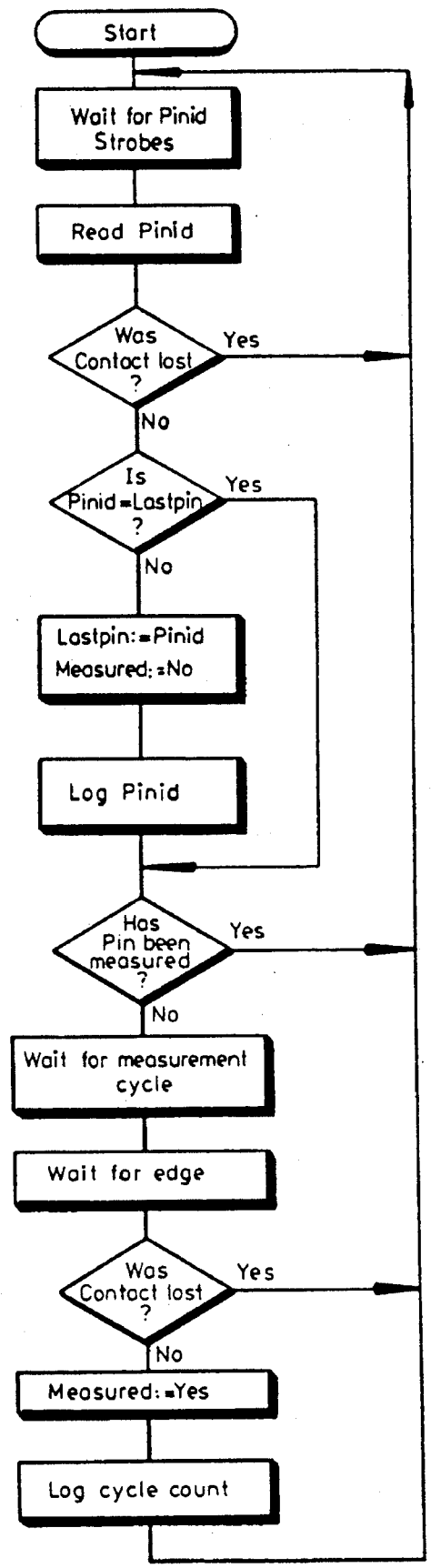
FIG. 11 is a flow diagram further illustrating the operation of the system of FIG. 1.

Referring now to FIG. 11, this illustrates in simplified form the control flow in the described test system. After starting, the system awaits receipt of pin identification strobe signals (middle waveform of FIG. 8). Once the strobe signal is detected, any detected pin identification signal is read. If the contact test signal (lower waveform of FIG. 8) indicates a break in physical contact between the pin and the probe, the system aborts the pin identification read and awaits the next strobe cycle. If contact was not lost, the pin identification is read and compared with the last valid identification code to be read. If there is no identity, the new pin identification code is logged and the next measurement signal is monitored. If there is identity, the previously logged pin identity is maintained. Once a pin identity has been established, subsequent measurement signals are awaited and a sampled edge is detected. Assuming contact is not lost during the measurement signals, the cycle count of the detected edge is logged.

It will be appreciated that a series of cycle counts could be logged for one pin to enable averaging or the like to improve accuracy. It will also be appreciated that alternative measurement techniques to those described above could be used to measure propagation delays.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A test system for determining propagation delays in signal paths leading to an array of pins associated with a circuit comprising:

(a) means for applying timing signals to each of the signal paths in parallel;

(b) means for applying a unique pin identifying signal to each of the signal paths;

(c) a probe adapted to be wiped across the pins for detecting signals on each pin with which it comes into contact;

(d) means for identifying a pin with which said probe is in contact from said unique pin identifying signal detected by said probe; and (e) means for calculating the propagation delay in the signal path leading to the pin with which said probe is in contact from said timing signals detected by said probe.

2. The test system of claim 1 further comprising means for alternately applying the timing signals and the pin identifying signals to each of the signal paths.

3. The test system of claim 1 wherein each pin identifying signal comprises a rectangular wave with individual portions representing one bit of a digital address code for each pin and wherein said means for identifying includes:

i) means for applying strobe pulse signals to each of the signal paths synchronized with said pin identifying signals, each of said strobe pulses coinciding in time with an individual one of the portions of said rectangular wave; and ii) means for sampling said pin identifying signals in synchronism with said strobe pulses in each signal path to derive said digital address code wherein the duration of each rectangular wave portion is sufficient to ensure that said strobe pulses coincide in time with the individual portions of said rectangular wave irrespective of propagation delays in the signal paths.

4. The test system of claim 1 wherein said timing signals comprise a rectangular wave of fixed frequency applied in phase to each signal path and wherein said calculating means compares the phase of each of said timing signals detected by said probe.

5. The test system of claim 4 wherein said calculating means comprises means for sampling each timing signal detected by said probe by applying a common clock signal to the signal paths having a different frequency from said fixed frequency.

6. The test system of claim 5 wherein said calculating means further comprises means for detecting an edge in said sampled data and means for recording a cycle count corresponding to the number of cycles in said common clock signal from the initiation of one of said timing signals to the detection of said edge.

7. The test system of claim 1 further comprising means for detecting the loss of electrical contact between said probe and a pin when said probe is detecting signals on a particular pin and means for rejecting signals detected when electrical contact between said probe and a pin is lost.

8. The test system of claim 7 wherein each of said pin identifying and timing signals alternates between a first and second voltage level, said test system further comprising means for maintaining said probe at a third voltage level if said probe is not in electrical contact with a pin.

9. The test system of claim 8 wherein said means for detecting the loss of electrical contact comprises means for detecting said third voltage level.

10. A method of determining propagation delays in signal paths leading to an array of pins associated with a circuit comprising the steps of:

(a) applying timing signals to each of the signal paths in parallel;

(b) applying a unique pin identification signal to each of the signal paths;

(c) wiping a probe across the pins to detect the timing and pin identification signals on the pin with which said probe is in electrical contact;

(d) identifying a pin with which said probe is in contact from said unique pin identification signal detected by said probe; and (e) calculating the propagation delay in the signal path leading to the pin with which the probe is in contact from the timing signals detected by the probe.

11. The method of claim 10 further comprising the step of alternately applying the timing signals and the pin identifying signals to each of the signal paths.

12. The method of claim 10 wherein each pin identifying signal includes individual portions each of which represent one bit of a digital address code corresponding to each pin and wherein said step (d) includes the sub-steps of:

(i) applying strobe pulse signals which coincide in time with each portion of all of said pin identifying signals to each of the signal paths;

(ii) sampling said pin identifying signals in synchronism with said strobe pulses to derive the digital address code for each pin.

13. The method of claim 10 wherein the phase of each of said timing signals are compared in said step (e) which includes the sub-steps of:

(i) sampling each timing signal detected by said probe by applying a common clock signal having a distinct frequency to the signal paths;

(ii) detecting an edge in said sampled data; and (iii) recording a cycle count corresponding to the number of cycles in said common clock signal from the initiation of a timing signal to the detection of an edge.

14. The method of claim 10 further comprising the steps of detecting the loss of electrical contact between said probe and a pin and rejecting signals detected by said probe upon detection of electrical contact loss between said probe and a pin.

* * * * *